350-96.27 SR
XR 3,625,686

3625686
OR IN 96/7

United States Patent Office 3,625,686
Patented Dec. 7, 1971

3,625,686
SIMULTANEOUS PHOTOPRINTING OF A PLURALITY OF REDUCED IMAGES

Ichiro Kitano, Kobe-shi, Hyogo-ken, Japan, assignor to Nippon Selfoc Kabushiki Kaisha (also known as Nippon Selfoc Co., Ltd.), Tokyo-to, Japan
Filed Aug. 19, 1969, Ser. No. 851,269
Claims priority, application Japan, Aug. 21, 1968, 43/60,094
Int. Cl. G03c 5/04
U.S. Cl. 96—27 R 3 Claims

ABSTRACT OF THE DISCLOSURE

A method for simultaneously printing a plurality of reduced images of a pattern on a photosensitive material, which comprises the steps of interposing an optical fiber plate between said pattern and photosensitive material, said optical fiber plate being formed of a bundle of a plurality of optical fibers each having such a refractive index distribution in a cross section thereof as to substantially satisfy the relation $$n=n_0(1-ar^2)$$

where $n_0$ represents the refractive index at the center thereof, $n$ represents the refractive index at a radial point at a distance $r$ from said center point, and $a$ is a positive constant; and causing the transmission a reduced image of said pattern through each of said optical fibers forming said optical fiber plate, thereby and producing the reduced images on said photosensitive material.

Use of the method in the production of integrated circuits is disclosed.

BACKGROUND OF THE INVENTION

The invention relates to a method of simultaneously printing a number of reduced images and, more specifically, to such a method to be employed most suitably in the production of integrated circuits.

Conventional integrated circuits are usually constructed by combining and inserting diodes, transistors, circuits and the like in such minute areas as 1 mm.×1 mm., and the production of precise integrated micro circuits has been successfully accomplished by use of the techniques of diffusion and photoengraving.

An example of the application of photoengraving for the production of an integrated circuit comprises the steps of; (a) coating a silicon base plate with a silicon oxide; (b) coating a film of a light sensitive resin thereon; (c) attaching a glass mask carrying a desired pattern to the photosensitive resin film and radiating parallel rays thereto so as to expose the resin to said rays, thereby reproducing the pattern on the resinous film; (d) dissolving off the unexposed portions with an organic solvent to leave a protective resinous film in the exposed areas ; (e) immersing the plate in a corrosive liquid with the result that the portions not covered by the film are corroded away and thus pitted; and (f) diffusing impurities into the silicon through the pit thus formed.

It is indispensably necessary to use a mask having accurately controlled dimensions in order to effect minute and precise photoengarving. According to a prior method of producing masks, an original pattern is photographed on a reduced scale, thereby forming an intermediary single pattern which is then further reduced and printed in multiplicity to obtain ultimate patterns. However, a bulky and expensive precision-made apparatus has been required for the production of the masks and, moreover, there has been a limit to the preciseness of photoengraving due to the thickness of the film of a mask used for the production of integrated circuits. Another drawback resides in the expense of producing such masks which are only usable for several tens of times; and, moreover, various troubles have been caused by the contact of the masks with surface of the silicon wafer.

SUMMARY OF THE INVENTION

Therefore, it is an essential object of the invention to provide a process of simultaneously printing a number of reduced images on a photosensitive film, in a very simple manner, in the production of masks for integrated circuits and of integrated circuits themselves by the use of a novel optical fiber plate unknown heretofore.

It is another object of the invention to provide an apparatus adapted to carry out the process of the above-mentioned essential object.

The above-mentioned objects and other objects of the invention have been attained by a process of simultaneously printing a number of reduced images, said process being characterized in that an optical fiber plate is formed by building a plurality of optical fibers each of which can transmit any image therethrough and has such a refractive index distribution in a cross section thereof as to nearly satisfy the relation $n=n_0(1-ar^2)$, where $n_0$ represents the refractive index at the center of said section, $n$ represents the refractive index at a distance $r$ from said center, and $a$ is a positive constant; an original pattern is transmitted in the form of an image through the individual fibers and focused on a photosensitive substance placed at an exit end face of the fiber plate.

The objects, characteristic features and function of the invention will be described in detail in conjunction with the drawings.

DETAILED DESCRIPTION OF THE INVENTION

The method of this invention has been made possible through the development of glass fibers capable of effectively transmitting any image, so that the following description of such glass fibers is given to facilitate a clear understanding of the invention.

The present inventor has succeeded in developing a new product embodying glass fibers having a refractive index progressively varying toward the center thereof by a process of immersing a glass fiber in a molten salt thereby to exchange the cations of the modifying oxides of the glass fiber with the cations in the molten salt (refer to U.S. patent application Ser. No. 806,368 filed Mar. 12, 1969, "Light Conducting Glass Structure and Process of the Production Thereof".)

The fact that a gaseous substance, having a refractive index distribution varying parabolically outward from a center, can function as lens is already known as the principle of a gas lens. The present inventor has discovered that a glass fiber, too, can function as a lens like the gaseous substance when said glass fiber is made to have such an isotropic refractive index distribution in a cross section thereof as to satisfy the equation $n=n_0$ $(1-ar^2)$, where $n_0$ represents the refractive index at the center of said section, $n$ represents the refractive index at a distinct $r$ from said center, and $a$ is a positive constant.

Figure 1:
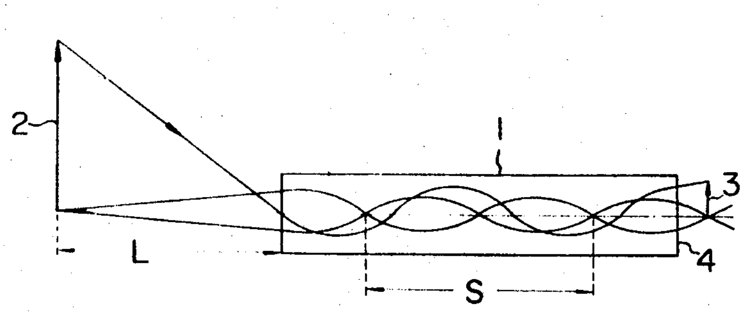
FIG. 1 illustrates a mode of image transmission in a glass fiber having a refractive index distribution represented by the relation $n=n_0(1-ar^2)$ which will be described in detail hereinafter.

Illustrated in FIG. 1 is an optical system of the above mentioned optical fiber.

In FIG. 1, the reference numeral 1 designates a glass fiber having such a refractive index distribution in a cross section as to nearly satisfy the said relation $n=n_0(1-ar^2)$. The light rays travelling through the interior of the fiber 1 are in the form of a sine wave having wavelength S corresponding to a wavelength of focuses of rays tra\el'ing through the fiber, as illustrated in FIG. 1, which satisfies the formula $2\pi(2a)^{-1/2}$, wherein $a$ is said positive constant. Accordingly, in FIG. 1, the light image from an object 2 travels through the fiber 1 in the form of a sine wave and forms an image 3 at a position outside the fiber 1. Although the image 3 is formed at a position outside the fiber 1 in this example, the image 3 can be formed at the exit end face 4 of the fiber 1 by adequately selecting the length of the fiber 1 and the distance L between the object 2 and fiber 1, whereby at the same time, it is possible to adjust the amount of reduction of the image 3 with respect to the object 2.

Theoretically, when a quarter of the above-mentioned wavelength $2\pi/\sqrt{2a}$ of the light travelling through the interior of the fiber 1 in the form of a sine wave is taken as $t_0$ and the length $t$ of the fiber is taken as represented by the following Equation 1:

$$2j\,t_0<t<(2j+1)\,t_0, \qquad (1)$$

where $j$ is zero or positive integer, an image of the object 2 placed out of the focal distance of the fiber 1 is formed at a position outside the fiber 1, in the form of an inverted real image when $j$ is 0 or an even number and in the form of an erect real image when $j$ is an odd number. In this instance, if it is assumed that the distance between the object 2 and the fiber's end face on the object side is L, the distance between the image and the fiber's end face on the image side is $t_1$, and a refractive index of a medium between the fiber 1 and image 3 is $n_G$, the following relations are obtained through the solution of a ray matrix:

$$t_1=\left|\frac{\cos(\sqrt{2a}t)+\frac{1}{Ln_0\sqrt{2a}}\sin(\sqrt{2a}t)}{\frac{n_0}{n_G}\left(-\sqrt{2a}\sin(\sqrt{2a}t)+\frac{1}{Ln_0}\cos(\sqrt{2a}t)\right)}\right| \qquad (2)$$

$$m=-\left\{\frac{Ln_0}{n_G}\sqrt{2a}\sin(\sqrt{2a}t)-\cos(\sqrt{2a}t)\right\}^{-1} \qquad (3)$$

where $m$=size of image /size of the object, that is, a ratio of reduction. In this case, the image becomes an erect image when $m$ is positive and an inverted image when $m$ is negative.

When $t$ is in a range given by:

$$(2j+1)t_0<t<(2j+2)t_0 \qquad (4)$$

where ($j$=0, 1, 2 . . .), an image of an object placed at a distance L represented by the following equation:

$$L=-\frac{\tan(\sqrt{2a}t)}{n^0\sqrt{2a}} \qquad (5)$$

is always formed on the exit end face 4 of the fiber 1 having a length $t$, in the form of an inverted image when $j$ is 0 or an even number and in the form of an erect image when $j$ is an odd number.

In this case, the following Equation 6 is obtained.

$$m=\cos(\sqrt{2a}t) \qquad (6)$$

When the Equations 5 and 6 are combined, the following relation is obtained.

$$L=\frac{1}{n_0\sqrt{2a}}\,\frac{\sqrt{1-m^2}}{|m|} \qquad (7)$$

Figure 2A:
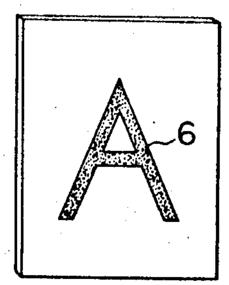
FIG. 2(A) shows a perspective pattern to be transmitted.
Figure 2B:
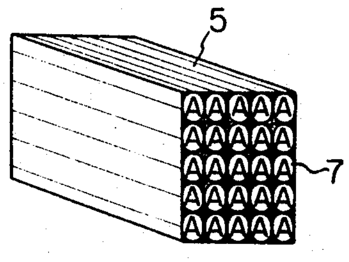
FIG. 2(B) shows a perspective optical fiber plate to be used in this invention, said plate showing a plurality images of the single pattern of FIG. 2(A)

FIG. 2 illustrates a case in which images of a pattern 6 shown in FIG. 2(A) are formed at the end faces 7 of novel individual glass fibers having characteristics as described above. The images are obtained by regulating the distance between the pattern 6 and an optical fiber plate 5 made by bundling a plurality of the above glass fibers and grinding both end faces thereof precicely in parallel with each other, said pattern 6 being placed in front of said fiber plate 5 and in parallel therewith.

The present invention concerns a method of simultaneously printing reduced images, said method utilizing an optical fiber plate consisting of novel glass fibers as described above.

Figure 3:
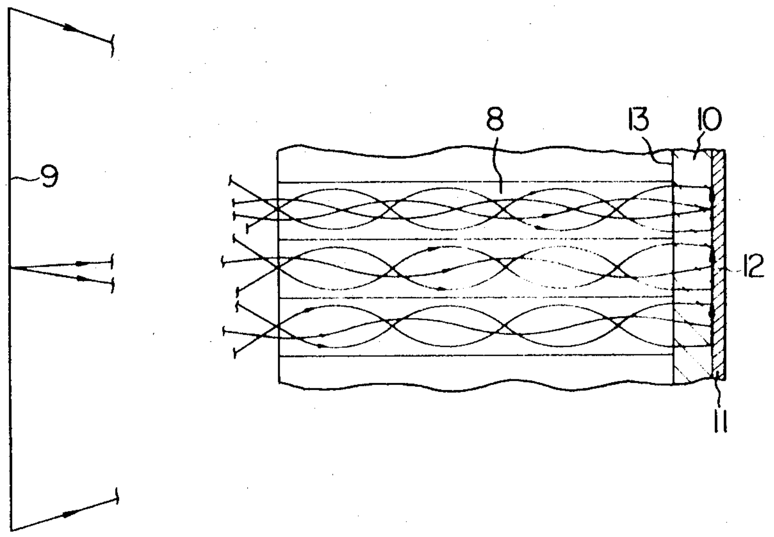
FIG. 3 is a schematic view plotted to explain function of the present invention.

In FIG. 3, the reference numeral 8 designates an optical fiber plate formed by bundling a plurality of glass fibers, wherein each fiber has a diameter of approx. 0.5–2 mm. and a refractive index distribution in a radial cross section thereof as described above. Both end faces of said optical fiber plate 8 are ground precisely to be perpendicular to the center axis thereof. An original pattern 9 to be printed is disposed in front of the optical fiber plate 8 so as to be in parallel therewith. On the opposite side of the optical fiber plate 8, a photosensitive material 11 is arranged in parallel with the end face of the plate 8 and spaced therefrom by a transparent substance such as a layer of air or a glass plate 10. The light carrying an image of the original pattern 9 is transmitted through the interiors of the individual fibers constituting the optical fiber plate 8, thereby forming reduced images on the photosensitive material 11. In this instance, the position where the images are formed and the ratio of reduction thereof are determined according to the Equations 1 through 7 depending upon the thickness of the optical fiber plate 8, and the distance between the optical fiber plate 8 and the original pattern 9, so that the images 12 reduced according to a desired ratio can be formed at the light-emitting end face 13 of the optical fiber plate 8 through the fine regulation of the thickness of the optical fiber plate 8 and the distance between the fiber plate 8 and the original pattern 9. In this case, the photosensitive material 11 may be directly attached to the light-emitting end face 13 of the optical fiber plate 8.

It is to be understood that the scope of the present invention is in no way restricted by the above description made with reference to the schematic view of FIG. 3: a lens may be interposed between the optical fiber plate 8 and original pattern 9 and, when the images 12 are to be formed at a position outside the optical fiber plate 8, an interval between the fiber plate 8 and photosensitive material 11 may be left as a layer of air. Furthermore, the word "fiber' used in the description of the invention relates to any structure having a relatively small sectional size, for instance to a structure having a circular section of a diameter below several mm. Accordingly, the fiber does not always mean a structure having a length larger than the sectional size and includes rod-, pillar-, disk-shaped and like structures. Furthermore, cross-section of the fiber may include circular, or polygonal shapes and the like. It is understood, moreover, that the application of the method of the invention is not confined to the production of integrated circuits, and that fibers need not be adjacent one another in the optical fiber plate of the invention.

In the process of the simultaneous printing of reduced images according to the present invention, as explained hereinbefore, an optical fiber plate is formed by bundling a plurality of novel glass fibers each having such a refractive index distribution in radius direction in a cross section thereof as to nearly satisfy the equation $$n=n_0(1-ar^2)$$

where $n_0$ represents the refractive index at the center thereof, $n$ represents the refractive index at a distance $r$ from said center, and $a$ is a positive constant; and reduced images of an original pattern are transmitted, through the individual fibers constituting the fiber plate, to be formed on a surface of a photosensitive material, so that the production of a photomask printed with several hundreds of diminutive patterns, such as integrated circuits, can be completed in one step and by means of a device of a simplified structure. Another notable feature of the invention is that the multiple printing of reduced images of an original pattern can be effected directly on a surface of a photosensitive resin of a silicon wafer without contacting the resin, thus dispensing with photomasks which have been inevitable for the production relating integrated circuits. As a result, the problems of to the high cost and required preciseness of such photoengraving masks are overcome, and various troubles caused by the contact of a wafer surface with a mask, including the consumption of the mask, the breaking of a circuit, and the degradation of the quality of duplicated images, are eliminated altogether.

Some specific examples of carrying out the invention will be described hereinbelow.

EXAMPLE 1

Glass composed of 20% wt. of $Tl_2O$, 10% wt. of PbO, 14% wt. of $Na_2O$ and 56% wt. of $SiO_2$ was shaped into a rod with a diameter of 1.0 mm., said rod was then steeped in a bath of potassium nitrate containing 0.2% wt. of thallium nitrate and held at 500° C. for 22 hours, whereby a glass fiber was produced having a center refractive index ($n_0$=1.60), a surface refractive index (1.55), and such a refractive index distribution in a radial cross section there of as to nearly satisfy the equation $n=n_0(\text{v}-ar^2)$, where $a$=12.5 cm.$^{-2}$, was obtained.

A total of 400 fibers thus obtained, 20 fibers both in vertical and transverse directions, were disposed in a parallel arrangement and secured by the use of an organic colored bonding agent containing an ultraviolet ray absorbent. There after, both end surfaces thereof, that is, the end faces of the optical fibers were ground precisely so as to be perpendicular to a center axis, thereby providing an optical fiber plate having an area of 20 mm. sq., and a thickness of 3.14 mm. A square-shaped original pattern each side of which is 30 cm. long was placed at a position 2.5 cm. in front of the optical fiber plate so as to be in parallel with an end surface of the plate. The original pattern was radiated with a mercury lamp, with a result that the image of the oirginal pattern was reduced by approx. 1/500 and formed in the end face of each of the fibers at the light-emitting end face of the optical fiber plate, as was confirmed by a microscope for image inspection. Next, in this instance, a dry plate of ultrafine particles was closely positioned to the light-emitting end face of the optical fiber plate and exposed so that pictures reduced by approx. 1/500 of the original were imprinted at positions corresponding to the glass fibers, as was microscopically confirmed.

EXAMPLE 2

Glass fibers with a diameter of 1.0 mm. and composed of 5% wt. of $Tl_2O$, 15% wt. of $Na_2O$, 20% wt. of PbO and 60% wt. of $SiO_2$ were steeped for 200 hours in a molten salt of potassium nitrate maintained at 480° C., thereby obtaining glass fibers having a center refractive index ($n_0$=1.55), a surface refractive index (1.53), and such a refractive index distribution as described above wherein $n=n_0(1-ar^2)$, where $a$=5.16 cm.$^{-2}$.

Glass of the above-mentioned composition was separately molded into a flat plate with a thickness of 10 mm. and measured as to percent transmission of rays in an ultraviolet region. The result proved that the transmittivity of ultraviolet rays is extremely superior.

The mentioned glass fibers were bundled in the same way as in Example 1, 20 fibers both in vertical and transverse directions, and secured with an organic colored bonding agent containing an ultraviolet ray absorbent. Thereafter, both end surfaces thereof, that is, the end faces of the optical fibers, were ground precisely so as to be perpendicular to the center axis, to form an optical fiber plate with a length of 20 mm. along its sides, and a thickness set at a value less than $t_0$=4.89 mm., namely, 3.50 mm. A square-shaped original pattern each side of which is 30 cm. long was placed at a position 200 cm. in front of the optical fiber plate so as to be in parallel with an end face of the plate, whereby images of the original pattern reduced by approx. 1/500 were formed at a position 0.96 mm. at a position spaced from the back of the optical fiber plate, as was confirmed by means of a microscope for image inspection. Then, a surface of a silicon wafer coated with a photosensitive resin and having a diameter of approx. 30 mm. was placed at a position where images of the reduced pattern are formed and in parallel with the end face of the optical fiber plate. The resinous surface was exposed by radiating the original pattern with ultraviolet rays, and a photoetching operation was effected after the processes of development and fixation, whereby 400 pictures reduced by approx. 1/500 of the original pattern were obtained on the wafer.

What is claimed is:

1. A method of simultaneously recording a plurality of reduced images of a single original pattern on a photosensitive material which comprises the steps of interposing an optical fiber plate in a focused relationship between a pattern and a photosensitive material, said optical fiber plate being formed by bundling a plurality of optical fibers each having such a refractive index distribution in a cross section thereof as to substantially satisfy the relation $n=n_0(1-ar^2)$ where $n_0$ represents the refractive index at the center point thereof, $n$ represents the refractive index at a radial position at a distance $r$ from said center point, and $a$ is positive constant; illuminating the original pattern so that a reduced image of the pattern is transmitted through each optical fiber, and maintaining the pattern, fiber plate and photosensitive material in an alignment wherein the image of the pattern is focused on the photosensitive material by each optical fiber, thereby exposing the photosensitive material at a plurality of areas corresponding to the number of optical fibers.

2. A method of simultaneously recording a plurality of reduced images on a photosensitive material as set forth in claim 1, further comprising the step of disposing the photosensitive material in contact with the end surfaces of the optical fibers at one side of the optical fiber plate.

3. A method of simulataneously recording a plurality of reduced images on a photosensitive material as set forth in claim 1, further comprising the step of providing a silicon wafer coated with a photosensitive resin as the photosensitive material.

References Cited

UNITED STATES PATENTS 3,520,114 5/1967 Schulz ------------ 350—96

NORMAN G. TORCHIN, Primary Examiner

J. WINKELMAN, Assistant Examiner

U.S. Cl. X.R.

96—36.2; 350—96; 355—1